(12) United States Patent
Liu et al.

(10) Patent No.: US 12,526,928 B2
(45) Date of Patent: Jan. 13, 2026

(54) ELECTRONIC DEVICE AND MANUFACTURING METHOD THEREOF

(71) Applicant: InnoLux Corporation, Miao-Li County (TW)

(72) Inventors: Yuan-Cheng Liu, Miao-Li County (TW); Meng-Syuan Wu, Miao-Li County (TW); Hsin-Cheng Chen, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 224 days.

(21) Appl. No.: 18/358,168

(22) Filed: Jul. 25, 2023

(65) Prior Publication Data

US 2024/0074068 A1    Feb. 29, 2024

(30) Foreign Application Priority Data

Aug. 25, 2022  (CN) .......................... 202211024716.6

(51) Int. Cl.
*H05K 1/02*  (2006.01)
*H05K 1/14*  (2006.01)
*H05K 3/36*  (2006.01)

(52) U.S. Cl.
CPC ............ *H05K 3/36* (2013.01); *H05K 1/0274* (2013.01); *H05K 1/142* (2013.01); *H05K 2201/044* (2013.01); *H05K 2201/10984* (2013.01)

(58) Field of Classification Search
CPC .... H05K 1/0271; H05K 1/0278; H05K 1/144; H05K 2201/041; H05K 2201/042; H05K 1/0274

See application file for complete search history.

(56) References Cited

U.S. PATENT DOCUMENTS

2010/0079966 A1\* 4/2010 Baek .................. G06F 11/1044
361/783
2023/0061955 A1\* 3/2023 Sinha ................ H01L 23/49838

FOREIGN PATENT DOCUMENTS

CN         113031340 A     6/2021

\* cited by examiner

*Primary Examiner* — Jeremy C Norris
(74) *Attorney, Agent, or Firm* — MUNCY, GEISSLER, OLDS & LOWE, P.C.

(57) ABSTRACT

An electronic device includes a back board, a circuit board, a first attaching member and a second attaching member. The circuit board is arranged on the back board. The first attaching member is arranged between the back board and the circuit board. The second attaching member is arranged between the back board and the circuit board. The circuit board is fixed on the back board through the first attaching member and the second attaching member, and a material of the first attaching member is different from that of the second attaching member.

20 Claims, 5 Drawing Sheets

ELECTRONIC DEVICE AND MANUFACTURING METHOD THEREOF

CROSS-REFERENCE TO RELATED APPLICATIONS

This application claims the benefits of the Chinese Patent Application Serial Number 202211024716.6, filed on Aug. 25, 2022, the subject matter of which is incorporated herein by reference.

BACKGROUND

Field of the Disclosure

The present disclosure relates to an electronic device and a manufacturing method thereof and, more particularly, to an electronic device having a first attaching member and a second attaching member and a manufacturing method thereof.

Description of Related Art

The electronic device has a circuit board that can be applied in various fields. Typically, the circuit board is fixed on the back board of the electronic device by screws. However, the aforementioned method still has defects such as high cost, time-consuming or poor reliability.

Therefore, it is desired to provide an electronic device in order to mitigate and/or obviate the prior defects.

SUMMARY

The present disclosure provides an electronic device, which includes: a back board; a circuit board arranged on the back board; a first attaching member arranged between the back board and the circuit board; and a second attaching member arranged between the back board and the circuit board, wherein the circuit board is fixed on the back plate through the first attaching member and the second attaching member, and a material of the first attaching member is different from a material of the second attaching member.

The present disclosure also provides a method of manufacturing an electronic device, which includes the steps of: providing a back board; arranging a circuit board on the back board; arranging a first attaching member between the back board and the circuit board; and arranging a second attaching member between the back board and the circuit board, wherein the circuit board is fixed on the back board through the first attaching member and the second attaching member, and a material of the first attaching member is different from a material of the second attaching member.

Other novel features of the disclosure will become more apparent from the following detailed description when taken in conjunction with the accompanying drawings.

DETAILED DESCRIPTION OF EMBODIMENT

Figure 1:
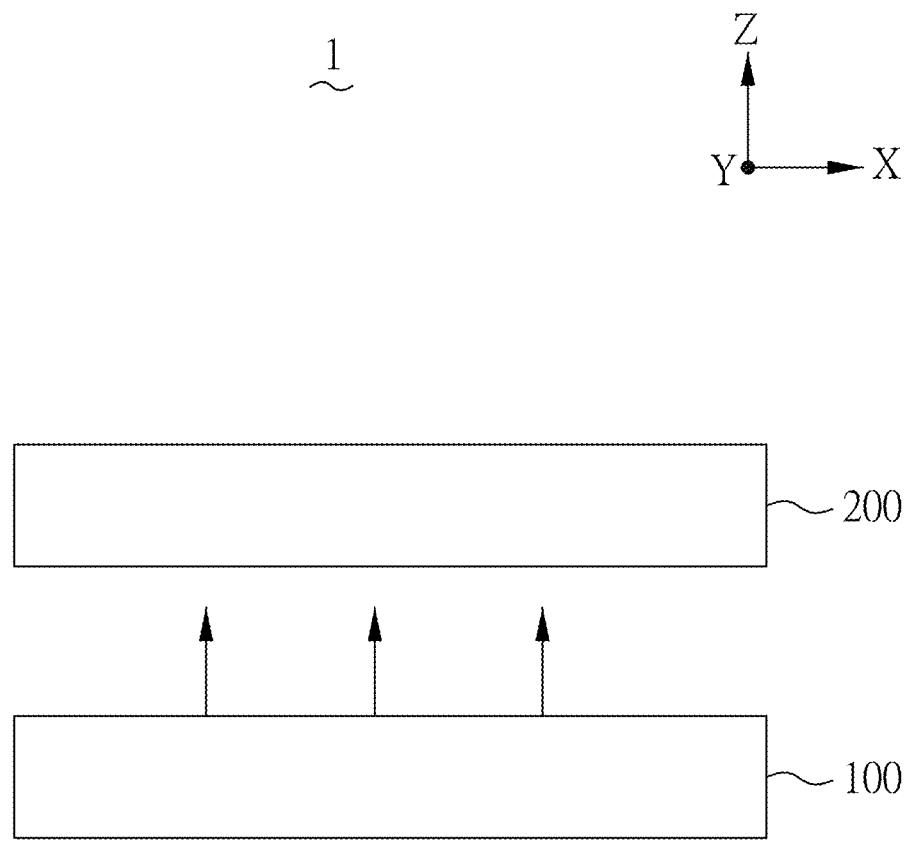
FIG. 1 is a schematic diagram of the electronic device according to an embodiment of the present disclosure.

Reference will now be made in detail to exemplary embodiments of the present disclosure, examples of which are illustrated in the accompanying drawings. Wherever possible, the same reference numerals are used in the drawings and description to refer to the same or like parts.

Throughout the specification and the appended claims, certain terms may be used to refer to specific components. Those skilled in the art will understand that electronic device manufacturers may refer to the same components by different names. The present disclosure does not intend to distinguish between components that have the same function but have different names. In the following description and claims, words such as "containing" and "comprising" are open-ended words, and should be interpreted as meaning "including but not limited to".

Directional terms mentioned in the specification, such as "up", "down", "front", "rear", "left", "right", etc., only refer to the directions of the drawings. Accordingly, the directional term used is illustrative, not limiting, of the present disclosure. In the drawings, various figures illustrate the general characteristics of methods, structures and/or materials used in particular embodiments. However, these drawings should not be construed to define or limit the scope or nature encompassed by these embodiments. For example, the relative sizes, thicknesses and positions of various layers, regions and/or structures may be reduced or enlarged for clarity.

One structure (or layer, component, substrate) described in the present disclosure is disposed on/above another structure (or layer, component, substrate), which can mean that the two structures are adjacent and directly connected, or can refer to two structures that are adjacent rather than directly connected. Indirect connection means that there is at least one intermediate structure (or intermediate layer, intermediate component, intermediate substrate, intermediate space) between the two structures, the lower surface of one structure is adjacent to or directly connected to the upper surface of the intermediate structure, and the upper surface of the other structure is adjacent to or directly connected to the lower surface of the intermediate structure. The intermediate structure may be a single-layer or multi-layer physical structure or a non-physical structure, which is not limited. In the present disclosure, when a certain structure is arranged "on" other structures, it may mean that a certain structure is "directly" on other structures, or it means that a certain structure is "indirectly" on other structures; that is, at least one structure is sandwiched, in between a certain structure and other structures. Terms related to joining and connecting, such as "connected" and "interconnected", unless otherwise specified, may refer to two structures that are in direct contact, or may also refer to two structures that are not in direct contact, and there are other structures provided between the two structures. Moreover, the terms about joining and connecting may also include the situation that both structures are movable, or both structures are fixed. In addition, the term "electrical connection" includes any direct and indirect electrical connection means.

The terms, such as "about", "equal to", "equal" or "same", "substantially", or "substantially", are generally interpreted as within 20% of a given value or range, or as within 10%, 5%, 3%, 2%, 1%, or 0.5% of a given value or range. In the present disclosure, the first direction is "substantially" perpendicular to the second direction and, more specifically, the angle between the first direction and the second direction may be between 80 degrees and 100 degrees.

In the specification and claims, unless otherwise specified, ordinal numbers, such as "first" and "second", used herein are intended to distinguish elements rather than disclose explicitly or implicitly that names of the elements bear the wording of the ordinal numbers. The ordinal numbers do not imply what order an element and another element are in terms of space, time or steps of a manufacturing method. Thus, what is referred to as a "first element" in the specification may be referred to as a "second element" in the claims.

In the present disclosure, the measurements of thickness, length, width and angle may be obtained by using an optical microscope, and the thickness or angle may be obtained by measuring a cross-sectional image in an electron microscope, but it is not limit thereto. Furthermore, the terms "a given range is from a first value to a second value", "a given range is within a range from the first value to the second value" means that the given range includes the first value, the second value and other values therebetween.

It is noted that the following are exemplary embodiments of the present disclosure, but the present disclosure is not limited thereto, while a feature of some embodiments can be applied to other embodiments through suitable modification, substitution, combination, or separation. In addition, the present disclosure can be combined with other known structures to form further embodiments.

Unless otherwise defined, all terms (including technical and scientific terms) used herein have the same meaning as commonly understood by those skilled in the art related to the present disclosure. It can be understood that these terms, such as those defined in commonly used dictionaries, should be interpreted as having meaning consistent with the relevant technology and the background or context of the present disclosure, and should not be interpreted in an idealized or excessively formal way. Unless there is a special definition in the embodiment of the present disclosure.

The electronic device of the present disclosure may include electronic components. The electronic device may include, for example, a display device, a light emitting device, an antenna device, a detection device, a touch display device, a curved display device or a free shape display device, but it is not limited thereto. The electronic device may be a bendable or flexible electronic device. The electronic device may include, for example, light emitting diodes, fluorescence, phosphor, other suitable display media, or a combination thereof, but it is not limited thereto. The electronic components may include passive components and active components, such as capacitors, resistors, inductors, diodes, transistors, and the like. The diodes may include light emitting diodes or photodiodes. The light emitting diode may, for example, include an organic light emitting diode (OLED), a sub-millimeter light emitting diode (mini LED), a micro light emitting diode (micro LED) or a quantum dot light emitting diode (quantum dot, QD, which may be, for example, QLED, QDLED) or other suitable materials or any permutation and combination of the above materials, but it is not limited thereto. The display device may include, for example, a tiled display device, but it is not limited thereto. The antenna device may be, for example, a liquid crystal antenna, but it is not limited thereto. It is noted that, the electronic device may be any permutation and combination of the above, but it is not limited thereto. In addition, the shape of the electronic device may be rectangular, circular, polygonal, with curved edges, or other suitable shapes. The electronic device may have peripheral systems such as a driving system, a control system, a light source system, a shelf system, etc. to support a display device or a tiled device. It is noted that, the electronic device may be any permutation and combination of the above, but it is not limited thereto. An electronic device may include multiple parts, and at least two of the parts may be assembled to form a combined object. In the following, a display device is used as an electronic device to illustrate the present disclosure. However, the present disclosure is not limited thereto.

FIG. 1 is a schematic diagram of the electronic device according to an embodiment of the present disclosure.

As shown in FIG. 1, the electronic device 1 of the present disclosure may include: a light source module 100; and a display panel 200 arranged on the light source module 100. The light source module 100 may provide light to the display panel 200 to display various images, and thus the electronic device 1 of the present disclosure may be a display device. In another embodiment (not shown), the electronic device may include a light source module, so the electronic device may be a light emitting device, but the present disclosure is not limited thereto.

In the present disclosure, although not shown in detail, the display panel 200 may include upper and lower substrates, display units, sealing members, alignment films, polarizers, black matrix layers, color filter layers and/or driving devices, etc., but the present disclosure is not limited thereto. In addition, the display panel may be, for example, a flexible display panel, a touch display panel, a curved display panel or a tiled display panel, but the present disclosure is not limited thereto. The electronic device of the present disclosure may be various electronic devices including display panels, such as monitors, mobile phones, notebook computers, video cameras, cameras, music players, mobile navigation devices, automotive electronic devices, televisions, etc. that have to display images, but the present disclosure is not limited thereto.

Figure 2A:
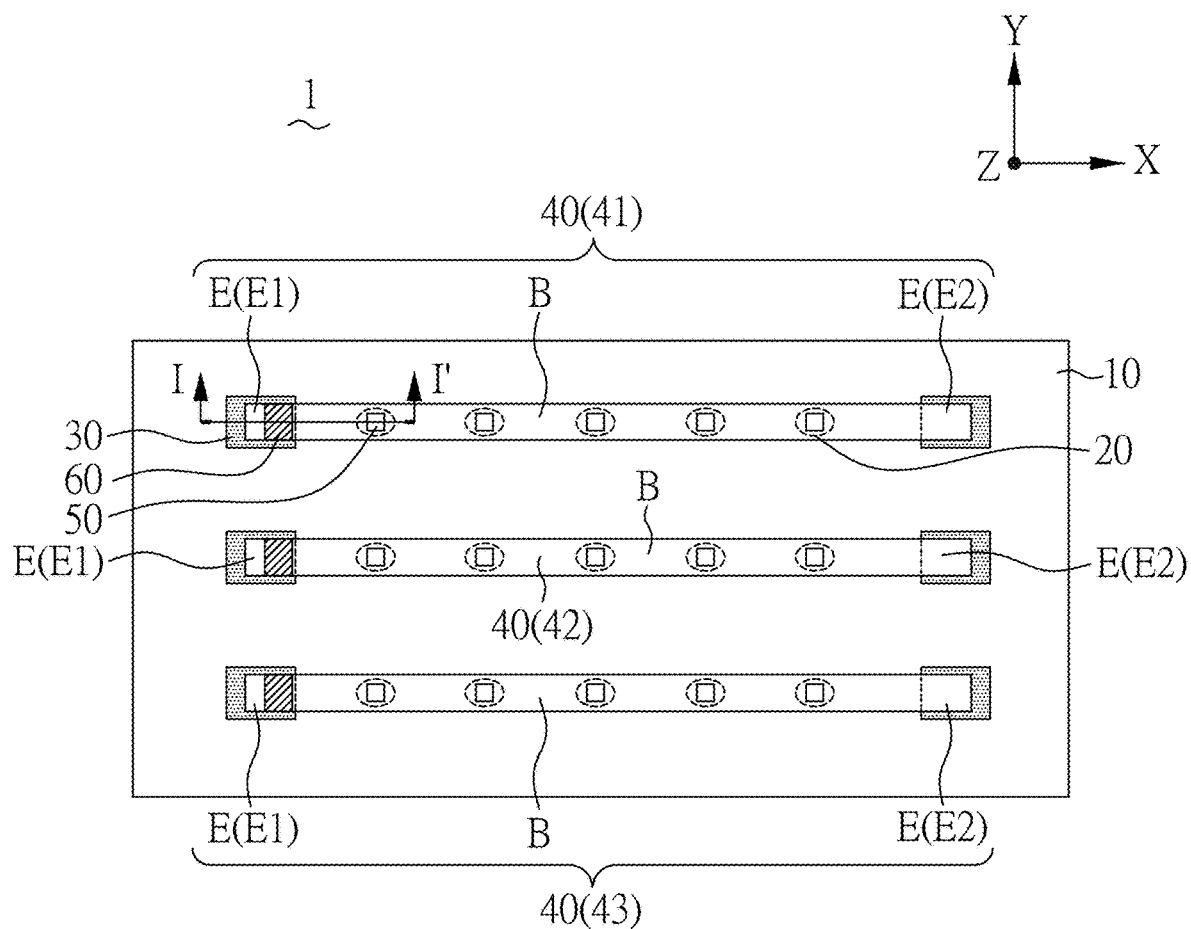
FIG. 2A is a top view of part of the electronic device according to an embodiment of the present disclosure.
Figure 2B:
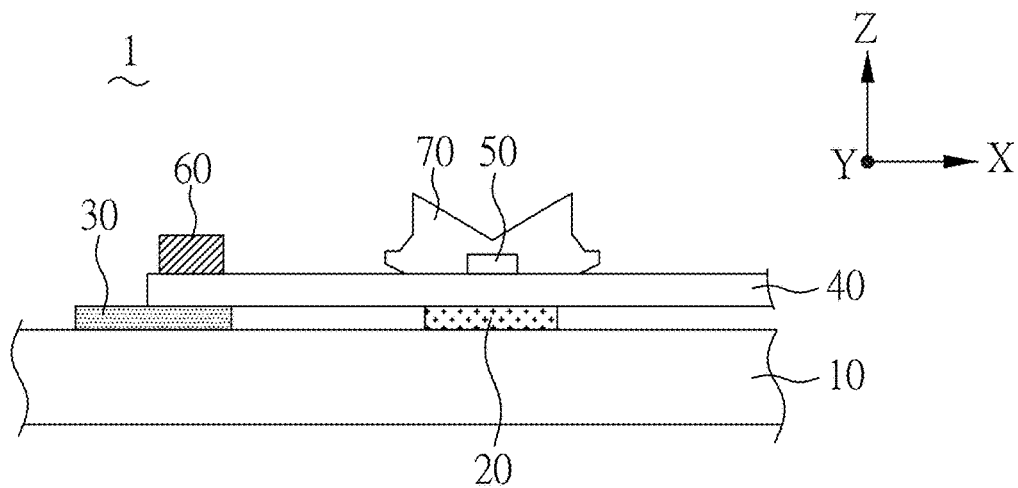
FIG. 2B is a cross-sectional view of the electronic device of FIG. 2A, taken along line I-I'.

FIG. 2A is a top view of part of the electronic device according to an embodiment of the present disclosure, and FIG. 2B is a cross-sectional view of the electronic device of FIG. 2A, taken along line I-I'.

As shown in FIG. 2A and FIG. 2B, a back board 10 is first provided. In the present disclosure, the material of the back board 10 may include metal, alloy, polycarbonate (PC), polyimide (PI), polypropylene (PP), polyethylene terephthalate (PET) or other plastic or polymer materials, or a combination thereof, but the present disclosure is not limited thereto.

A circuit board 40 is arranged on the back board 10. In the present disclosure, the circuit board 40 may be a printed circuit board (PCB) or a flexible printed circuit board (FPCB). At least one electronic component 50 may be arranged on the circuit board 40 before the circuit board 40 is arranged on the back board 10, wherein the electronic component 50 may be electrically connected to the circuit board 40. The electronic component 50 may be, for example, a light emitting diode, but the disclosure is not limited thereto. The circuit board 40 may be used to transmit signals and power to the electronic component 50 so as to drive the electronic component 50.

Next, a first attaching member 20 and a second attaching member 30 are each arranged between the back board 10 and the circuit board 40, wherein the circuit board 40 may be fixed on the back board 10 through the first attaching member 20 and the second attaching member 30. In the present disclosure, the material of the first attaching member 20 is different from the material of the second attaching member 30. The material of the first attaching member 20 may include silicon, such as silica gel, but the present disclosure is not limited thereto. The material forming the first attaching member 20 may be liquid or gel at room temperature, and may be cured after moisture absorption to form the first attaching member 20 for fixing. The cured first attaching member 20 needs a higher temperature (e.g., at least greater than 200 degrees Celsius, i.e., 200° C.) to be softened into a liquid or gel state again. The material of the second attaching member 30 may include a polymer material, such as pressure sensitive adhesive (PSA), hot melt pressure sensitive adhesive (HMPSA), hot melt adhesive, UV glue, double-sided tape, or a combination thereof, but the present disclosure is not limited thereto. The material forming the second attaching member 30 may be in solid, gel or liquid state at room temperature. In some embodiments, when the material of the second attaching member 30 is hot melt pressure sensitive adhesive or hot melt adhesive, it may be heated (for example, between 130° C. and 200° C.) into liquid state for being processed, and may be cured again after cooling to form the second attaching member 30 for fixing. In some embodiments, when the material forming the second attaching member 30 is UV glue, it may be cured after being irradiated by a UV lamp (e.g., a mercury lamp) to form the second attaching member 30 for fixing, and the cured second attaching member 30 may be softened into a liquid state again in an environment with a temperature at least greater than 90° C. In some embodiments, when the material of the second attaching member 30 is pressure sensitive adhesive or double-sided tape, the second attaching member 30 may be directly adhered on the back board 10 or the circuit board 40. In an embodiment of the present disclosure, the softening temperature of the first attaching member 20 may be greater than the softening temperature of the second attaching member 30. The "softening temperature" refers to the temperature at which the first attaching member 20 or the second attaching member 30 arranged on the back board 10 or the circuit board 40 is gradually heated and begins to soften into a liquid or gel state again. Since the cured first attaching member 20 needs a higher temperature (for example, at least greater than 200° C.) to soften again into a liquid or gel state, the softening temperature of the first attaching member 20 may be considered higher than the softening temperature of the second attaching member 30. In the present disclosure, the first attaching member 20 and the second attaching member 30 may be each arranged on the back board 10 or the circuit board 40 by using a suitable processing method (such as spray coating method, spin coating method, dispensing, adhering and other processing methods). In addition, the processing methods of the first attaching member 20 and the second attaching member 30 may be the same or different, while the present disclosure is not limited thereto. In the present disclosure, the processing sequence of the first attaching member 20 and the second attaching member 30 is not particularly limited. For example, the first attaching member 20 may be arranged on the back board 10 or the circuit board 40 first, and then the second attaching member 30 may be arranged on the back board 10 or the circuit board 40; or the second attaching member 30 may be arranged on the back board 10 or the circuit board 40 first, and then the first attaching member 20 may be arranged on the back board 10 or the circuit board 40; or the first attaching member 20 and the second attaching member 30 may be arranged on the back board 10 or the circuit board 40 at the same time. In the present disclosure, the thickness and shape of the first attaching member 20 and the second attaching member 30 are not particularly limited, and may be adjusted as required.

Therefore, the electronic device 1 of the present disclosure may include: a back board 10; a circuit board 40 arranged on the back board 10; a first attaching member 20 arranged between the back board 10 and the circuit board 40; and a second attaching member 30 arranged between the back board 10 and the circuit board 40, wherein the circuit board 40 is fixed on the back board 10 through the first attaching member 20 and the second attaching member 30. In the electronic device 1 of the present disclosure, by fixing the circuit board 40 on the back board 10 through the first attaching member 20 and the second attaching member 30, and utilizing the feature of the materials of the first attaching member 20 and the second attaching 30 being different, it is able to achieve the purposes of saving costs and/or improving adhesion.

In the present disclosure, as shown in FIG. 2A and FIG. 2B, the circuit board 40 may be provided with a connecting member 60, wherein the connecting member 60 may be electrically connected to the circuit board 40. The connecting member 60 may be electrically connected to an external signal or power for transmitting the external signal or power to the circuit board 40. In one embodiment of the present disclosure, as shown in FIG. 2B, when the electronic component 50 is a light emitting diode, an optical adjustment unit 70 may be further arranged on the circuit board 40; more specifically, the optical adjustment unit 70 is arranged on the circuit board 40 and on the electronic component 50, and the optical adjustment unit 70 may be arranged corresponding to the electronic component 50. The optical adjustment unit 70 may be used to adjust (for example, concentrate or disperse) the light emitted by the electronic component 50 to enhance or improve the light quality of the electronic device 1. In the present disclosure, the optical adjustment unit 70 may at least partially overlap with the electronic component 50 in the top view direction (e.g., third direction Z) of the electronic device 1. In addition, although not shown in detail in FIG. 1, the light source module 100 may further include an optical film set such as s reflective sheet, light guide plate, and diffusion sheet, but the present disclosure is not limited thereto.

In the present disclosure, as shown in FIG. 2A, in the third direction Z of the electronic device 1, the circuit board 40 may extend along the first direction X. In the first direction X, the circuit board 40 may have a main body portion B and two end portions E (such as a first end portion E1 and a second end portion E2). The main body portion B is connected to the two end portions E and is disposed between the two end portions E, wherein the second attaching member 30 may be arranged corresponding to at least one end portion E of the circuit board 40, and the electronic component 50 may be arranged corresponding to the main body portion B of the circuit board 40, and disposed between the two end portions E (for example, the electronic component 50 may be disposed between the first end portion E1 and the second end portion E2). In one embodiment of the present disclosure, the first attaching member 20 may be disposed corresponding to the electronic component 50. More specifically, in the third direction Z of the electronic device 1, the electronic component 50 may at least partially overlap with the first attaching member 20. As a result, it is able to reduce the warpage of the circuit board 40 due to the heat energy generated by the electronic components 50 during operation. In one embodiment of the present disclosure, the second attaching member 30 may be arranged corresponding to the end portion E of the circuit board 40 (such as the first end portion E1 and/or the second end portion E2). More specifically, in the third direction Z of the electronic device 1, the second attaching member 30 may at least partially overlap with the end portion E of the circuit board 40. In one embodiment of the present disclosure, the connecting member 60 may be arranged corresponding to an end portion E (e.g., the first end portion E1) of the circuit board 40. More specifically, in the third direction Z of the electronic device 1, the connecting member 60 may at least partially overlap with the end portion E (e.g., the first end portion E1) of the circuit board 40. In one embodiment of the present disclosure, in the third direction Z of the electronic device 1, the connecting member 60 may at least partially overlap with the second attaching member 30.

In the present disclosure, as shown in FIG. 2A, the electronic device 1 may further include a plurality of circuit boards 40 (such as a first circuit board 41, a second circuit board 42, and a third circuit board 43), which are arranged on the back board 10; and a plurality of electronic components 50 respectively arranged on the first circuit board 41, the second circuit board 42 and the third circuit board 43, wherein the first circuit board 41, the second circuit board 42 and the third circuit board 43 may be arranged along the second direction Y, and the second circuit board 42 may be arranged between the first circuit board 41 and the third circuit board 43. The first circuit board 41, the second circuit board 42 and the third circuit board 43 may be each fixed on the back board 10 through the first attaching member 20 and the second attaching member 30. Here, the circuit boards 40 (such as the first circuit board 41, the second circuit board 42 and the third circuit board 43), the first attaching member 20, the second attaching member 30 and the electronic components 50 can be known from the above description, and thus a detailed description is deemed unnecessary.

As shown in FIG. 2A, the electronic device 1 may include a plurality of first attaching members 20 respectively corresponding to the main body portions B of the first circuit board 41, the second circuit board 42 and the third circuit board 43, and the first attaching members 20 may be arranged respectively corresponding to the electronic components 50. Therefore, the first attaching members 20 may be formed by using a coating process, and has an approximately circular block shape, but the present disclosure is not limited thereto. Similarly, the second circuit board 42 and the third circuit board 43 may be designed to be similar to the first circuit board 41, and thus a detailed description is deemed unnecessary.

As shown in FIG. 2A, the electronic device 1 may include a plurality of second attaching members 30 respectively corresponding to the end portions E of the first circuit board 41, the second circuit board 42 and the third circuit board 43. Therefore, in the third direction Z of the electronic device 1, the second attaching members 30 may respectively at least partially overlap with the end portions E of the first circuit board 41, the second circuit board 42 and the third circuit board 43. The second attaching member 30 may have an approximately rectangular block shape, but the present disclosure is not limited thereto.

Figure 3:
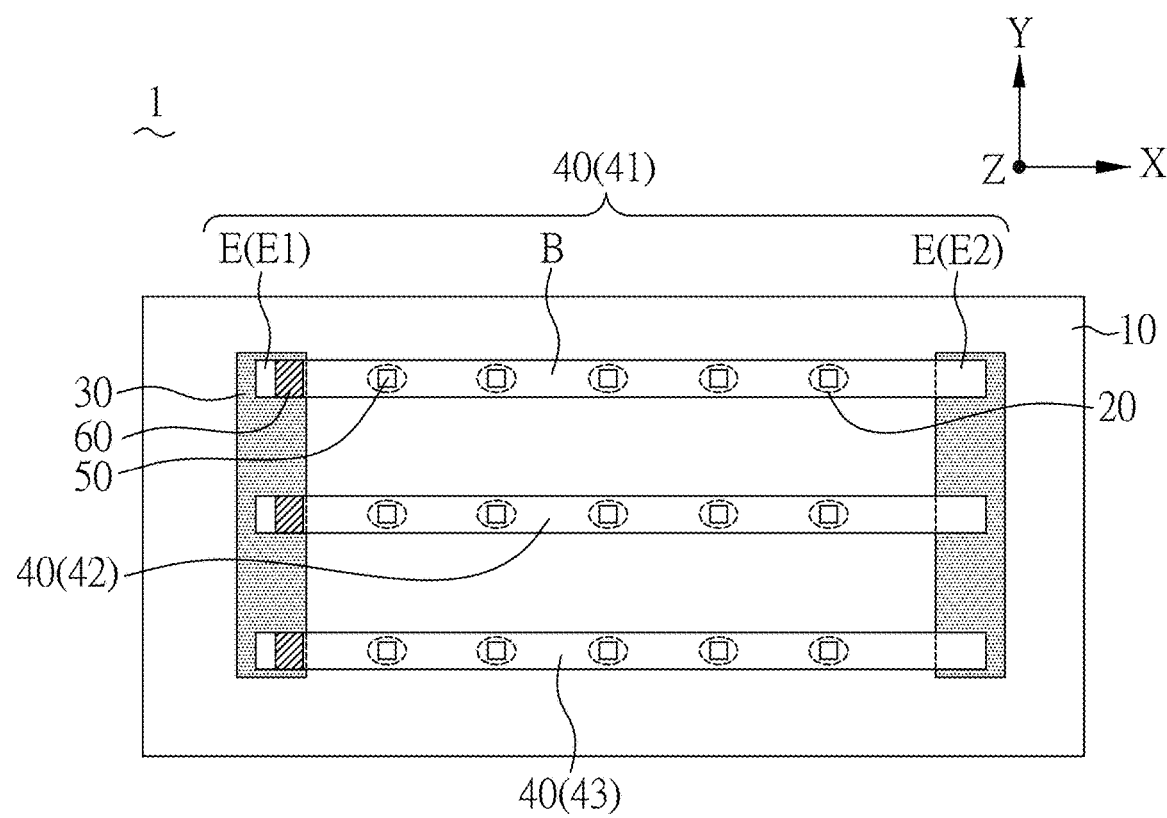
FIG. 3 is a top view of part of the electronic device according to another embodiment of the present disclosure.

FIG. 3 is a top view of part of the electronic device according to another embodiment of the present disclosure, wherein the electronic device of FIG. 3 is similar to that of FIG. 2A except for the following differences.

In this embodiment, as shown in FIG. 3, the second attaching member 30 may extend continuously along the second direction Y, and is arranged corresponding to the end portions E of the first circuit board 41, the second circuit board 42 and the third circuit board 43 at the same time. More specifically, for example, the second attaching member 30 may correspond to the first end portion E1 of the first circuit board 41, the first end portion E1 of the second circuit board 42, and the first end portion E1 of the third circuit board 43 at the same time. Therefore, in the third direction Z of the electronic device 1, the second attaching member 30 may at least partially overlap with the end portions E of a plurality of circuit boards 40 at the same time. The second attaching member 30 may be a long strip structure and has an approximately rectangular shape, wherein the long strip structure may extend along the second direction Y.

Figure 4:
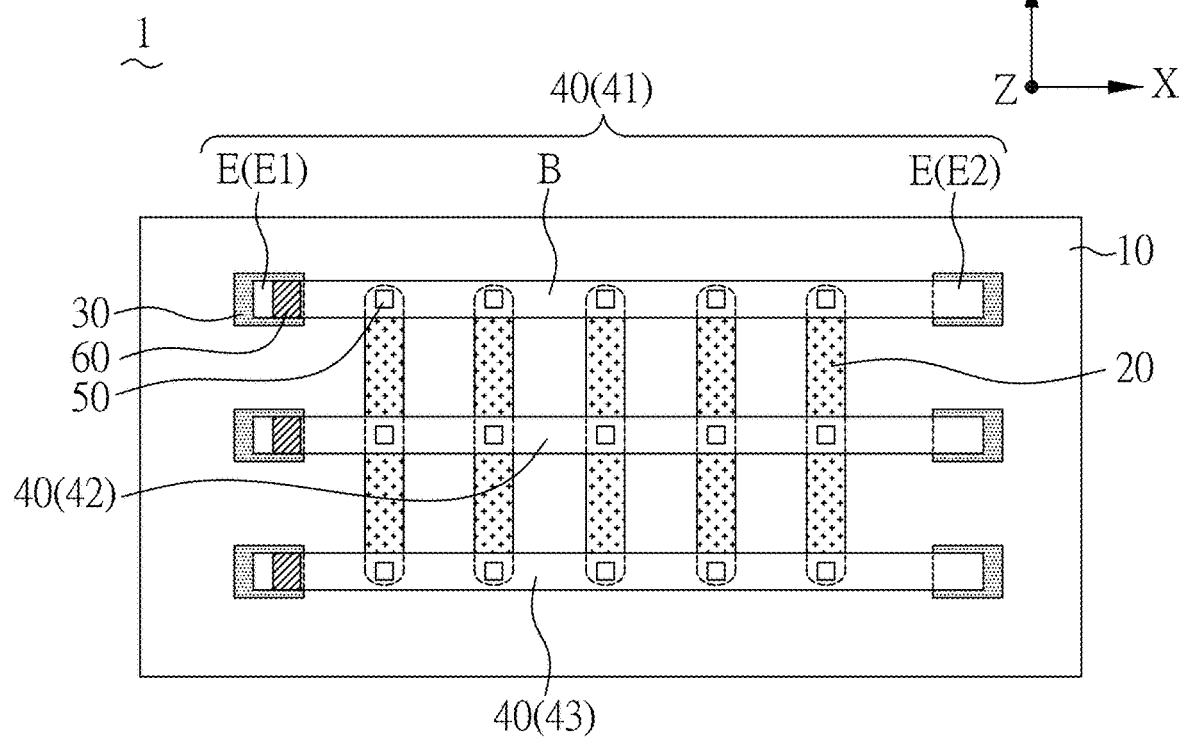
FIG. 4 is a top view of part of the electronic device according to still another embodiment of the present disclosure.

FIG. 4 is a top view of part of the electronic device according to still another embodiment of the present disclosure, wherein the electronic device of FIG. 4 is similar to that of FIG. 2A except for the following differences.

In this embodiment, as shown in FIG. 4, the first attaching member 20 may extend along the second direction Y, and is arranged corresponding to the main body portions B of the first circuit board 41, the second circuit board 42 and the third circuit board 43 at the same time, and the first attaching member 20 may be arranged corresponding to a plurality of electronic components 50 at the same time. More specifically, the first attaching member 20 may be arranged corresponding to at least one electronic component 50 on the first circuit board 41, at least one electronic component 50 on the second circuit board 42, and at least one electronic component 50 on the third circuit board 43 at the same time. Therefore, in the third direction Z of the electronic device 1, the first attaching member 20 may at least partially overlap with the electronic components 50 on a plurality of different circuit boards at the same time. The first attaching member 20 may be a strip structure and have a strip shape, wherein the strip structure may extend along the second direction Y. In addition, in one embodiment of the present disclosure, in the third direction Z of the electronic device 1, at least part of the first attaching member 20 and the circuit board 40 may not overlap.

Figure 5:
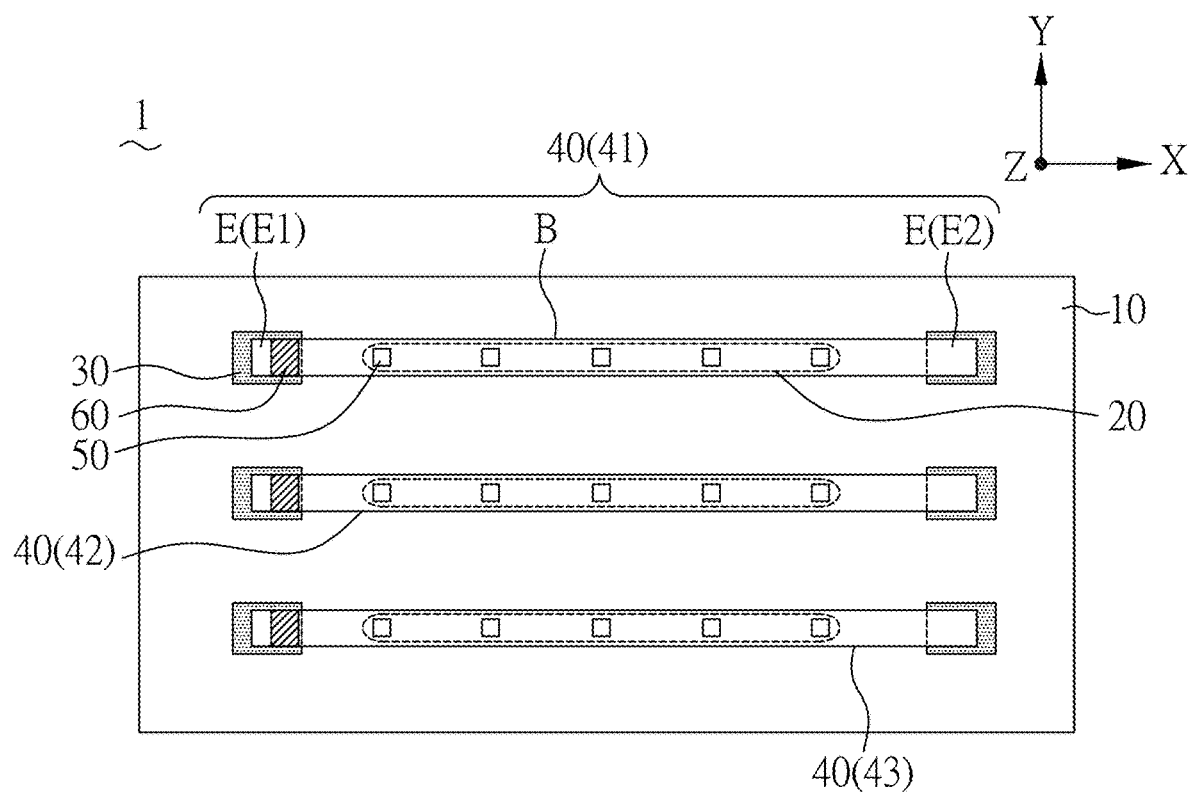
FIG. 5 is a top view of part of the electronic device according to yet another embodiment of the present disclosure.

FIG. 5 is a top view of part of the electronic device according to yet another embodiment of the present disclosure, wherein the electronic device of FIG. 5 is similar to that of FIG. 2A except for the following differences.

In this embodiment, as shown in FIG. 5, the electronic device 1 may include a first attaching member 20 arranged between the back board 10 and a circuit board 40 (e.g., the first circuit board 41); and a plurality of electronic components 50 arranged on a circuit board 40 (e.g., the first circuit board 41), wherein the first attaching member 20 may extend along the first direction X, and is arranged corresponding to the plurality of electronic components 50 at the same time. Therefore, in the third direction Z of the electronic device 1, the first attaching member 20 may at least partially overlap with a plurality of electronic components 50 on the same circuit board 40 (e.g., the first circuit board 41) at the same time. The first attaching member 20 may be a long strip structure and have a long strip shape, wherein the long strip structure may extend along the first direction X. Similarly, as shown in FIG. 5, the second circuit board 42 and the third circuit board 43 may be designed to be similar to the first circuit board 41, and thus a detailed description is deemed unnecessary.

Figure 6:
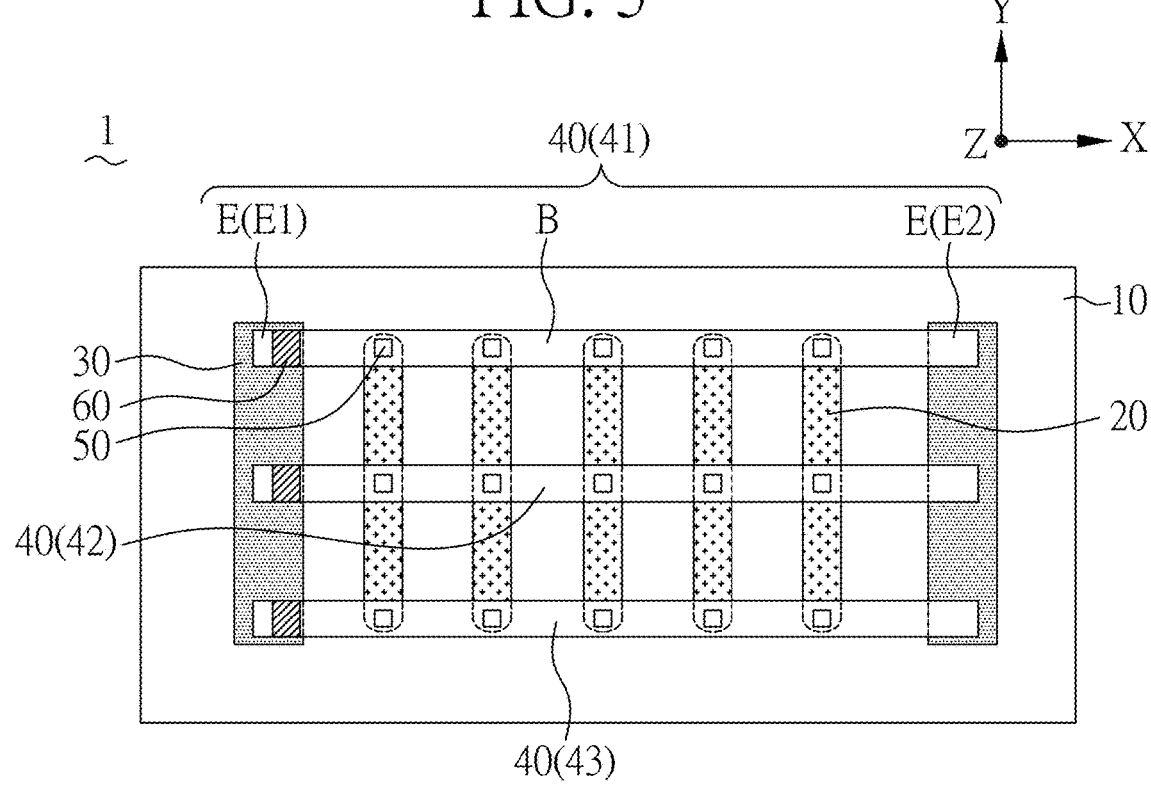
FIG. 6 is a top view of part of the electronic device according to further another embodiment of the present disclosure.

FIG. 6 is a top view of part of the electronic device according to further another embodiment of the present disclosure, wherein the electronic device of FIG. 6 is similar to that of FIG. 2A except for the following differences.

In this embodiment, as shown in FIG. 6, the first attaching member 20 may extend along the second direction Y, and is arranged corresponding to the main body portions B of the first circuit board 41, the second circuit board 42 and the third circuit board 43 at the same time, and the first attaching member 20 may be arranged corresponding to the electronic components 50 on a plurality of different circuit boards at the same time. More specifically, the first attaching member 20 may be arranged corresponding to at least one electronic component 50 on the first circuit board 41, at least one electronic component 50 on the second circuit board 42, and at least one electronic component 50 on the third circuit board 43 at the same time. Therefore, in the third direction Z of the electronic device 1, the first attaching member 20 may at least partially overlap with the plurality of electronic components 50 on different circuit boards 40 at the same time. The first attaching member 20 may be a strip structure and have a strip shape, wherein the strip structure may extend along the second direction Y. In addition, in one embodiment of the present disclosure, in the third direction Z of the electronic device 1, at least part of the first attaching member 20 may not overlap with the circuit boards 40.

In addition, in this embodiment, as shown in FIG. 6, the second attaching member 30 may extend along the second direction Y, and is arranged corresponding to the end portions E of the first circuit board 41, the second circuit board 42 and the third circuit board 43 at the same time. More specifically, for example, the second attaching member 30 may be arranged corresponding to the first end portion E1 of the first circuit board 41, the first end portion E1 of the second circuit board 42, and the first end portion E1 of the third circuit board 43 at the same time. Therefore, in the third direction Z of the electronic device 1, the second attaching member 30 may at least partially overlap with the end portions E of the plurality of circuit boards 40 at the same time. The second attaching portion 30 may be a strip structure and have a strip shape, wherein the strip structure may extend along the second direction Y.

Figure 7:
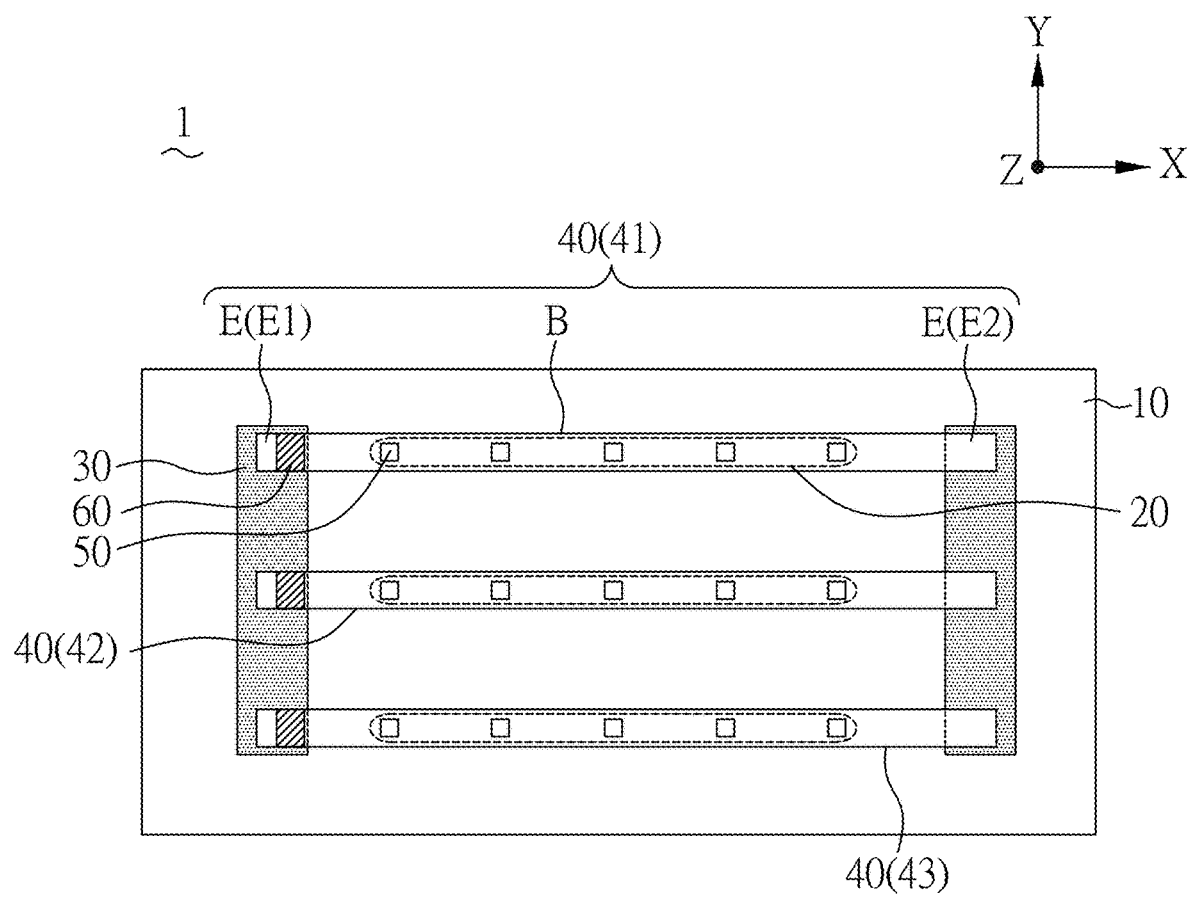
FIG. 7 is a top view of part of the electronic device according to still further another embodiment of the present disclosure.

FIG. 7 is a top view of part of the electronic device according to still further embodiment of the present disclosure, wherein the electronic device of FIG. 7 is similar to that of FIG. 2A except for the following differences.

In this embodiment, as shown in FIG. 7, the electronic device 1 may include a first attaching member 20 arranged between the back board 10 and a circuit board 40 (e.g., the first circuit board 41); and a plurality of components 50 arranged on a circuit board 40 (e.g., the first circuit board 41). The first attaching member 20 may extend along the first direction X, and is arranged corresponding to a plurality of electronic components 50 at the same time. Therefore, in the third direction Z of the electronic device 1, the first attaching member 20 may at least partially overlap with a plurality of electronic components 50 on the same circuit board 40 (e.g., the first circuit board 41) at the same time. The first attaching member 20 may be a strip structure and have a strip shape, wherein the strip shape may extend along the first direction X. Similarly, as shown in FIG. 7, the second circuit board 42 and the third circuit board 43 may be designed to be similar to the first circuit board 41, and thus a detailed description is deemed unnecessary.

In addition, in this embodiment, as shown in FIG. 7, the second attaching member 30 may extend along the second direction Y, and is arranged corresponding to the end portions E of the first circuit board 41, the second circuit board 42 and the third circuit board 43 at the same time. More specifically, for example, the second attaching member 30 may be arranged corresponding to the first end portion E1 of the first circuit board 41, the first end portion E1 of the second circuit board 42, and the first end of the third circuit board 43 at the same time. Therefore, in the third direction Z of the electronic device 1, the second attaching member 30 may at least partially overlap with the end portions E of the plurality of circuit boards 40 at the same time. The second attaching member 30 may be a strip structure and have a strip shape, wherein the strip structure may extend along the second direction Y.

Figure 8:
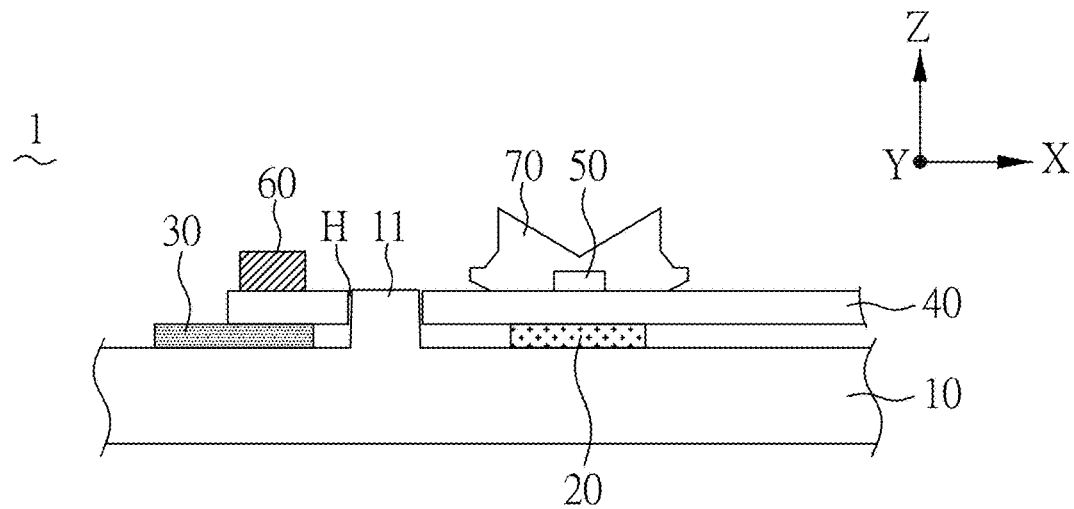
FIG. 8 is a cross-sectional view of part of the electronic device according to an embodiment of the present disclosure.

FIG. 8 is a cross-sectional view of part of the electronic device according to an embodiment of the present disclosure, wherein FIG. 8 is similar to FIG. 2B except for the following differences.

As shown in FIG. 8, the back board 10 may include a protrusion 11, and the circuit board 40 may include an opening H, wherein the opening H is arranged corresponding to the protrusion 11. In the present disclosure, the position of the protrusion 11 of the back board 10 is not particularly limited, and the circuit board 40 may engage with the protrusion 11 of the back board 10 through the opening H for alignment, thereby alleviating the assembly errors. In one embodiment of the present disclosure, in the third direction Z of the electronic device 1, the projection of the protrusion 11 of the back board 10 may overlap with the projection of the opening H of the circuit board 40. More specifically, in the third direction Z of the electronic device 1, the projection of the protrusion 11 of the back board 10 may be within the projection of the opening H of the circuit board 40.

The characteristics of the first attaching member and the second attaching member are analyzed as follows.

The material of the first attaching member A is a first type of silica gel, the material of the first attaching B is a second type of silica gel, and the material of the second attaching member A is hot-melt pressure-sensitive adhesive, and the material of the second attaching member B is UV glue. At room temperature, the first type of silica gel and the second type of silica gel are in liquid state or gel state, the hot-melt pressure-sensitive adhesive is in solid state, and the UV glue is in liquid state. The test for adhesion is carried out by the adhesion test, which is based on the cross-cut test standard of ASTM D3002/D3359. Specifically, the test sample is cut into grid lines with a distance of 1 millimeter (mm) by using a blade in the horizontal and vertical directions, thereby forming 100 square grids each having a length of 1 mm and a width of 1 mm. Next, the 600 test tape of 3M is used to stick the surface of the grid-shaped test sample and tear it off, and the surface state of the test sample torn off with the tape is measured and evaluated according to the specification. The test results are expressed in ASTM grades, in which 5B indicates that there is no peeling surface; 4B indicates that, based on the total surface area, the total peeled surface does not exceed 5%; 3B indicates that, based on the total surface area, the total peeled surface is 5% to 15%; 2B indicates that, based on the total surface area, the total peeled surface is 15% to 35%; 1B indicates that, based on the total surface area, the total peeled surface is 35% to 65%; and 0B indicates that almost all of the surface is peeled.

At room temperature, the first type of silica gel and the second type of silica gel are coated on the back board (the material thereof includes iron). After absorbing moisture, the first type of silica gel and the second type of silica gel are cured into solids to form the first attaching member A and the first attaching member B, respectively. The cured first attaching member A and first attaching member B are respectively tested for adhesion by the adhesion test. The test results are expressed in ASTM grades, wherein the first attaching member A is 5B, and the first attaching member B is 2B to 4B. In addition, the cured first attaching member A and first attaching member B need a higher temperature (e.g., at least greater than 200° C.) to soften into a liquid or gel state again. At room temperature, the cured first attaching member A and first attaching member B are touched with fingers, and it is found that there is some stickiness or no stickiness.

In addition, the first type of silica gel and the second type of silica gel are respectively coated on an iron plate with a thickness of about 0.8 mm (the iron plate is used as the test back board). Next, aluminum plates, each having a thickness of about 1.0 mm (the aluminum plate is used as a test circuit board), are respectively placed on the test back board. After absorbing moisture, the first type of silica gel and the second type of silica gel are cured to form the first attaching member A and the first attaching member B, so as to fix the test circuit board on the test back board. Then, the test circuit board and the test back board are disassembled and separated. By respectively observing the residual conditions of the first attaching member A and the first attaching member B, it is found that most of the first attaching member A is retained on the test circuit board, while most of the first attaching member B is retained on the test back board.

The hot-melt pressure-sensitive adhesive is heated at a temperature of 160° C. to 180° C. to be converted into a liquid state, and then the liquid hot-melt pressure-sensitive adhesive is applied to the test back board, so that the hot-melt pressure-sensitive adhesive will be cured after cooling to form the second attaching member A. In addition, at room temperature, liquid UV glue is applied on the test back board, and a mercury lamp of 800 mW/cm 2 is used to irradiate the UV glue for being cured to form the second attaching member B. The cured second attaching member A and second attaching member B are respectively tested for adhesion by the adhesion test. The test results are expressed in ASTM grades, wherein the second attaching member A is 5B, and the second attaching member B is 5B. In addition, the cured second attaching member A and second attaching member B will respectively soften into a liquid state again when the temperature is greater than 90° C. At room temperature, the cured second attaching member A and second attaching member B are touched with fingers, and it is found that both are viscous, while the viscosity is greater than that of the first attaching member A and the first attaching member B.

In addition, based on the aforementioned method, the hot-melt pressure-sensitive adhesive and the UV glue are respectively applied on the iron plate with a thickness of about 0.8 mm (the iron plate is used as the test back board). Next, aluminum plates, each having a thickness of about 1.0 mm (the aluminum plate is used as a test circuit board), are respectively placed on the test back board. After the hot-melt pressure-sensitive adhesive and the UV glue are cured, the second attaching member A and the second attaching member B are formed, so as to fix the test circuit board on the test back board. Then, the test circuit board and the test back board were disassembled and separated. By respectively observing the residual conditions of the second attaching member A and the second attaching member B, it is found that the area of the test circuit board retained with the second attaching member A is similar to the area of the test back board retained with the second attaching member A, with no significant difference, while most of the second attaching member B is retained on the test back board.

The aforementioned specific embodiments should be interpreted as illustrative only, but not limiting the rest of the disclosure in any way, and the features of different embodiments may be mixed and matched as long as they do not conflict with each other.

The invention claimed is:

1. An electronic device, comprising:
    a back board;
    a circuit board arranged on the back board;
    a first attaching member arranged between the back board and the circuit board; and
    a second attaching member arranged between the back board and the circuit board,
    wherein the circuit board is fixed on the back board through the first attaching member and the second attaching member, and a material of the first attaching member is different from that of the second attaching member,
    wherein a material of the first attaching member includes silicon, and a material of the second attaching member includes a polymer material.

2. The electronic device as claimed in claim 1, wherein a softening temperature of the first attaching member is greater than that of the second attaching member.

3. The electronic device as claimed in claim 1, wherein the circuit board has two end portions in a top view direction of the electronic device, and the second attaching member is arranged corresponding to at least one of the end portions of the circuit board.

4. The electronic device as claimed in claim 3, further comprising at least one electronic component, wherein the at least one electronic component is arranged on the circuit board and disposed between the two end portions.

5. The electronic device as claimed in claim 4, wherein the at least one electronic component and the first attaching member at least partially overlap in a top view direction of the electronic device.

6. The electronic device as claimed in claim 4, further comprising an optical adjustment unit arranged on the circuit board and the electronic component, and the optical adjustment unit is arranged corresponding to the electronic component.

7. The electronic device as claimed in claim 1, further comprising a plurality of circuit boards, wherein the circuit boards are arranged on the back board, each circuit board extends along a first direction and has a main body portion and two end portions, the main body portion is connected with the two end portions and disposed between the two end portions, the circuit boards are arranged along a second direction, and the main body portion of each circuit board is arranged with at least one electronic component.

8. The electronic device as claimed in claim 7, further comprising a plurality of first attaching members, wherein the first attaching members are arranged respectively corresponding to the main body portions of the circuit boards.

9. The electronic device as claimed in claim 7, further comprising a plurality of second attaching members, wherein the second attaching members are arranged respectively corresponding to the end portions of the circuit boards.

10. The electronic device as claimed in claim 7, wherein the second attaching member extends along the second direction, and is arranged corresponding to the end portions of the circuit boards.

11. The electronic device as claimed in claim 7, wherein the first attaching member extends along the second direction, and is arranged corresponding to the main body portions of the circuit boards at the same time, and the first attaching member is arranged corresponding to the electronic components on the circuit boards at the same time.

12. The electronic device as claimed in claim 7, wherein the first attaching member is arranged between the back board and one of the circuit boards, the one of the circuit boards is arranged with a plurality of electronic components, and the first attaching member extends along the first direction, and is arranged corresponding to the electronic components on the one of the circuit boards at the same time.

13. The electronic device as claimed in claim 7, wherein the first attaching member extends along the second direction, and is arranged corresponding to the main body portions of the circuit boards at the same time, and the first attaching member is arranged corresponding to the electronic components on the plurality of circuit boards at the same time; the second attaching member extends along the second direction, and is arranged corresponding to the end portions of the circuit boards at the same time.

14. The electronic device as claimed in claim 7, wherein the first attaching member is arranged between the back board and one of the circuit boards, the one of the circuit boards is arranged with a plurality of electronic components, and the first attaching member extends along the first direction, and is arranged corresponding the electronic components on the one of the circuit boards; the second attaching member extends along the second direction, and is arranged corresponding to the end portions of the circuit boards.

15. The electronic device as claimed in claim 1, wherein the back board has a protrusion, the circuit board has an opening, and the opening is arranged corresponding to the protrusion.

16. A method for manufacturing an electronic device, comprising the steps of:
providing a back plate;
arranging a circuit board on the back board;
arranging a first attaching member between the back board and the circuit board; and
arranging a second attaching member between the back board and the circuit board,
wherein the circuit board is fixed on the back board through the first attaching member and the second attaching member, and a material of the first attaching member is different from that of the second attaching member,
wherein a material of the first attaching member includes silicon, and a material of the second attaching member includes a polymer material.

17. The method as claimed in claim 16, wherein the circuit board has two end portions in the top view direction of the electronic device, the second attaching member is arranged corresponding to at least one end portion of the circuit board.

18. The method as claimed in claim 17, further comprising the step of arranging at least one electronic component on the circuit board, wherein the at least one electronic component is disposed between the two end portions.

19. The method as claimed in claim 18, wherein the at least one electronic component and the first attaching member at least partially overlap in a top view direction of the electronic device.

20. An electronic device, comprising:
a back board;
a circuit board arranged on the back board;
a first attaching member arranged between the back board and the circuit board; and
a second attaching member arranged between the back board and the circuit board,
wherein the circuit board is fixed on the back board through the first attaching member and the second attaching member, and a material of the first attaching member is different from that of the second attaching member, and
wherein the back board has a protrusion, the circuit board has an opening, and the opening is arranged corresponding to the protrusion.

* * * * *